United States Patent
Kuo et al.

(10) Patent No.: US 8,835,193 B2
(45) Date of Patent: Sep. 16, 2014

(54) NON-UNIFORM ALIGNMENT OF WAFER BUMPS WITH SUBSTRATE SOLDERS

(71) Applicant: Taiwan Semiconductor Manufacturing Company, Ltd., Hsin-Chu (TW)

(72) Inventors: Hung-Jui Kuo, Hsin-Chu (TW); Chung-Shi Liu, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 91 days.

(21) Appl. No.: 13/886,783

(22) Filed: May 3, 2013

(65) Prior Publication Data

US 2013/0236994 A1    Sep. 12, 2013

Related U.S. Application Data

(63) Continuation of application No. 12/784,327, filed on May 20, 2010, now Pat. No. 8,446,007.

(60) Provisional application No. 61/253,305, filed on Oct. 20, 2009.

(51) Int. Cl.
*H01L 21/66* (2006.01)

(52) U.S. Cl.
USPC .......... 438/16; 438/26; 438/28; 438/761; 438/780; 257/76; 257/100; 257/E33.059

(58) Field of Classification Search
USPC .......... 438/16–127, 761, 780, 902, 928, 956; 257/76, 680, 790, 100, 21.502, 257/E33.059
See application file for complete search history.

(56) References Cited

U.S. PATENT DOCUMENTS

| 4,581,680 | A | 4/1986 | Garner |
| 5,777,855 | A | 7/1998 | Yokajty |
| 6,053,395 | A | 4/2000 | Sasaki |
| 6,274,474 | B1 | 8/2001 | Caletka et al. |
| 6,335,222 | B1 | 1/2002 | DiStefano |
| 6,444,561 | B1 | 9/2002 | Wang et al. |
| 6,472,607 | B1 | 10/2002 | Someya et al. |
| 6,974,330 | B2 | 12/2005 | Caldwell et al. |
| 7,213,740 | B2 | 5/2007 | Rinne |
| 7,759,776 | B2 | 7/2010 | Cheng |
| 8,080,884 | B2 | 12/2011 | Nakamura et al. |
| 8,178,392 | B2 | 5/2012 | Choi et al. |
| 2005/0094382 | A1 | 5/2005 | Lassar et al. |
| 2005/0282311 | A1* | 12/2005 | Chen et al. .................... 438/108 |
| 2006/0208041 | A1 | 9/2006 | MacKay et al. |
| 2006/0278992 | A1 | 12/2006 | Trezza et al. |
| 2007/0152020 | A1 | 7/2007 | Rinne |

(Continued)

*Primary Examiner* — Alexander Sofocleous
*Assistant Examiner* — Ankush Singal
(74) *Attorney, Agent, or Firm* — Slater & Matsil, L.L.P.

(57) ABSTRACT

An integrated circuit structure includes a work piece selected from the group consisting of a semiconductor chip and a package substrate. The work piece includes a plurality of under bump metallurgies (UBMs) distributed on a major surface of the work piece; and a plurality of metal bumps, with each of the plurality of metal bumps directly over, and electrically connected to, one of the plurality of UBMs. The plurality of UBMs and the plurality of metal bumps are allocated with an overlay offset, with at least some of the plurality of UBMs being misaligned with the respective overlying ones of the plurality of metal bumps.

20 Claims, 13 Drawing Sheets

(56) References Cited

U.S. PATENT DOCUMENTS

| | | |
|---|---|---|
| 2007/0169342 A1 | 7/2007 | Lassar et al. |
| 2008/0185735 A1 | 8/2008 | Pham et al. |
| 2008/0213976 A1 | 9/2008 | Farnworth |
| 2008/0265408 A1 | 10/2008 | Kaufmann et al. |
| 2009/0079067 A1 | 3/2009 | Gerber |
| 2009/0181533 A1 | 7/2009 | Gorrell et al. |

* cited by examiner

NON-UNIFORM ALIGNMENT OF WAFER BUMPS WITH SUBSTRATE SOLDERS

This application is a continuation of and claims benefit of U.S. patent application Ser. No. 12/784,327, filed May 20, 2010, entitled "Non-Uniform Alignment of Wafer Bumps with Substrate Solders," which further claims the benefit of U.S. Provisional Application No. 61/253,305 filed on Oct. 20, 2009, entitled "Non-Uniform Alignment of Wafer Bumps with Substrate Solders," which application is hereby incorporated herein by reference.

TECHNICAL FIELD

This application relates generally to integrated circuits and more particularly to packaging assemblies comprising IC chips and package substrates and methods for forming the same.

BACKGROUND

Modern integrated circuits are formed on semiconductor chips. To increase manufacturing throughput and lower manufacturing costs, the integrated circuits are manufactured in semiconductor wafers, each containing many identical semiconductor chips. After the integrated circuits are manufactured, semiconductor chips are sawed from the wafers and packaged before they can be used.

In typical packaging processes, semiconductor chips (also referred to as dies in the art) are first attached to package substrates. This includes physically securing the semiconductor chips on the package substrates and connecting bonding pads on the semiconductor chips to bonding pads on the package substrates. Underfill, which typically comprises epoxy, is used to further secure the bonding. The semiconductor chips may be bonded using either flip-chip bonding or wire bonding. The resulting packages are referred to as ball grid array (BGA) modules. A plurality of chips having different functions may be integrated in a same BGA module to form a system-in-package (SIP) module.

FIGS. 1 and 2 illustrate cross-sectional views of intermediate stages in the packaging of semiconductor chip 100 onto package substrate 110. Semiconductor chip 100 includes bumps 102 and flux 104 on bumps 102. Package substrate 110 includes solder bumps 112. The positions and pitches of bumps 102 and solder bumps 112 are designed to accurately align to each other. However, since package substrate 110 (and/or semiconductor chip 100) has multiple layers formed of different materials, solder bumps 112 may have position shift (as symbolized by arrows 114) caused by the stresses resulted from the multiple layers. The position shift may cause the pitches between solder bumps 112 to be changed from the designed values. As a result, as shown in FIG. 2, when semiconductor chip 100 and package substrate 110 are bonded together, bumps 102 and solder bumps 112 are no longer accurately aligned. This may cause further stress to semiconductor chip 100 and may cause an open circuit in the case, if some of bumps 102 are fully misaligned to the corresponding solder bumps 112.

SUMMARY

In accordance with one aspect of the embodiment, an integrated circuit structure includes a work piece selected from the group consisting of a semiconductor chip and a package substrate. The work piece includes a plurality of under bump metallurgies (UBMs) distributed on a major surface of the work piece; and a plurality of metal bumps, with each of the plurality of metal bumps directly over, and electrically connected to, one of the plurality of UBMs. The plurality of UBMs and the plurality of metal bumps are allocated with an overlay offset, with at least some of the plurality of UBMs being misaligned with the respective overlying ones of the plurality of metal bumps.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments and do not limit the scope of the disclosure.

A novel method for manufacturing an integrated circuit in accordance with an embodiment is presented. The intermediate stages of manufacturing an embodiment are illustrated. The variations of the embodiment are then discussed. Throughout the various views and illustrative embodiments, like reference numbers are used to designate like elements.

Figure 1:
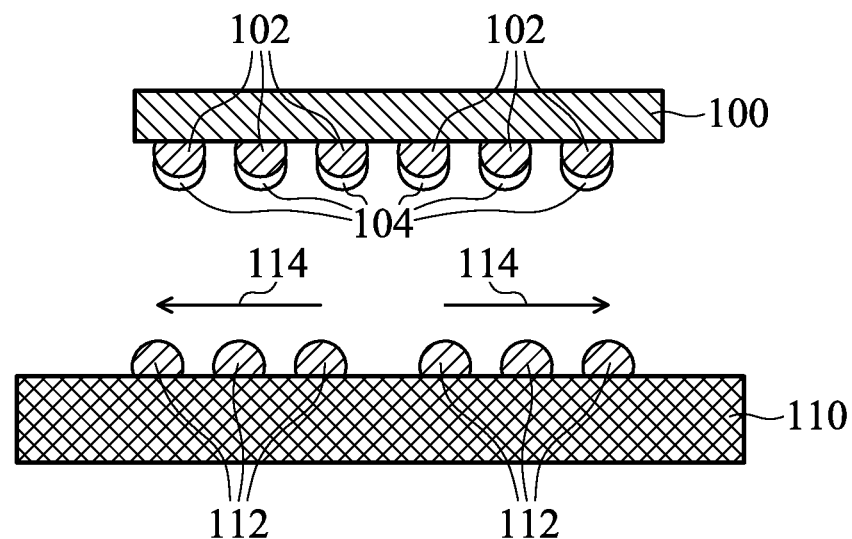
FIGS. 1 and 2 are cross-sectional views of intermediate stages in a conventional bonding process for bonding a semiconductor chip to a package substrate.
Figure 2:
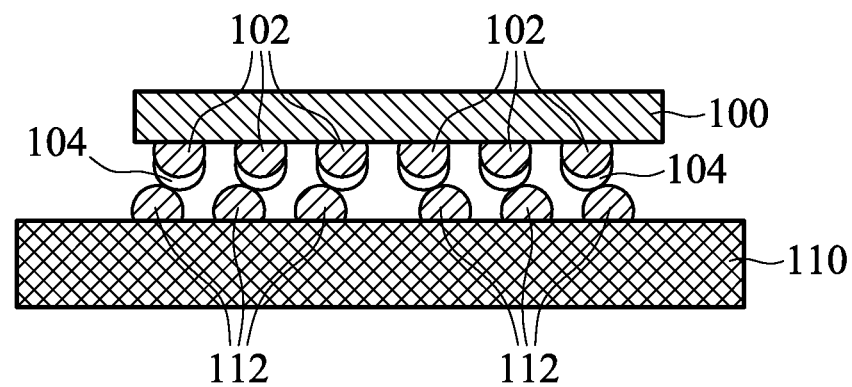
Figure 3A:
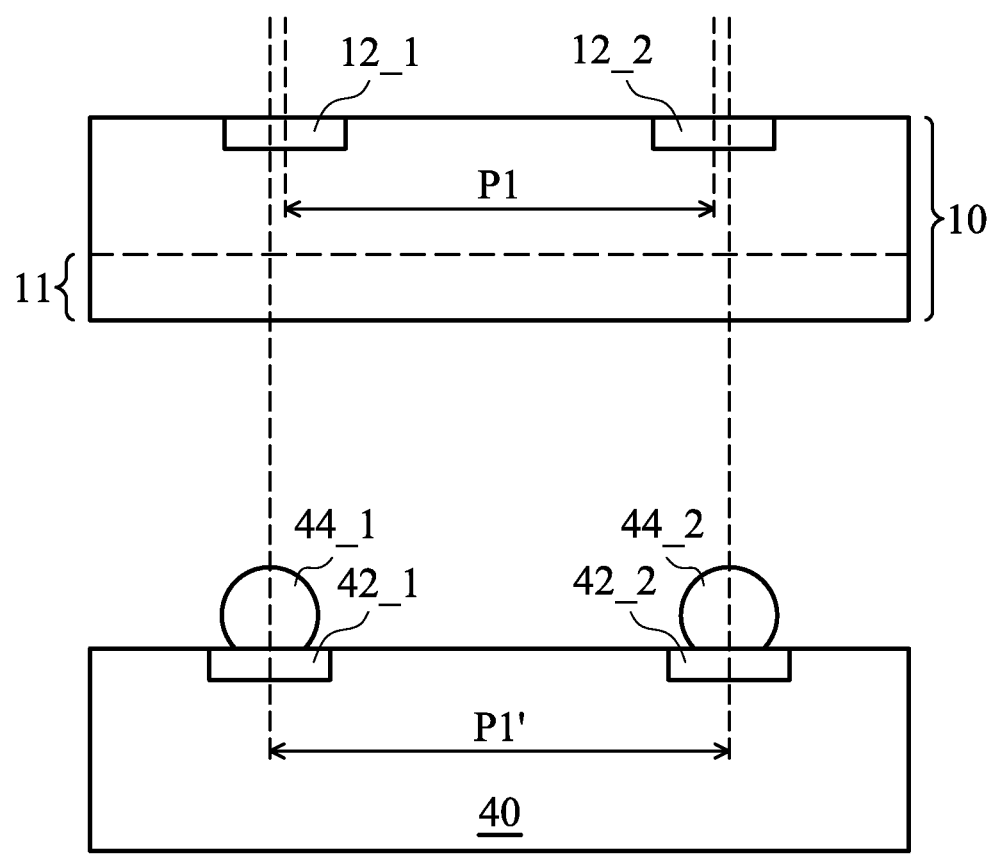
FIGS. 3A through 7 are cross-sectional views and top views of intermediate stages in the formation of bumps in accordance with the embodiments.

FIG. 3A illustrates a cross-sectional view of semiconductor chip 10 and package substrate 40. It is appreciated that semiconductor chip 10 and package substrate 40 are shown in a same plane for illustration and comparison purposes, although they are actually discrete components. The formation of package substrate 40 has been completed, while the bumps of semiconductor chip 10 have not been formed. Semiconductor chip 10 may include semiconductor substrate 11 and integrated circuit devices (not shown), such as transistors formed at the surface of semiconductor substrate 11. Semiconductor chip 10 may also have a warpage. Metallic connection features 12 (denoted as 12_1 and 12_2), which may be under bump metallurgies (UBMs) or bond pads, are formed on the surface of semiconductor chip 10. The pitch between UBMs 12_1 and 12_2 is P1. Throughout the drawings, the pitches between two features are measured from the centers of the two features, although they can also be measured from corresponding edges. Package substrate 40 includes routing metal lines and vias (not shown), which may electrically connect solder bumps 44 (denoted as 44_1 and 44_2) from one side of package substrate 40 to the opposite side. Package substrate 40 further includes metallic connections 42 (denoted as 42_1 and 42_2), which may be UBMs or bond pads. Solder bumps 44 are formed on UBMs 42. The pitch between UBMs 42_1 and 42_2 is P1'.

Figure 3B:
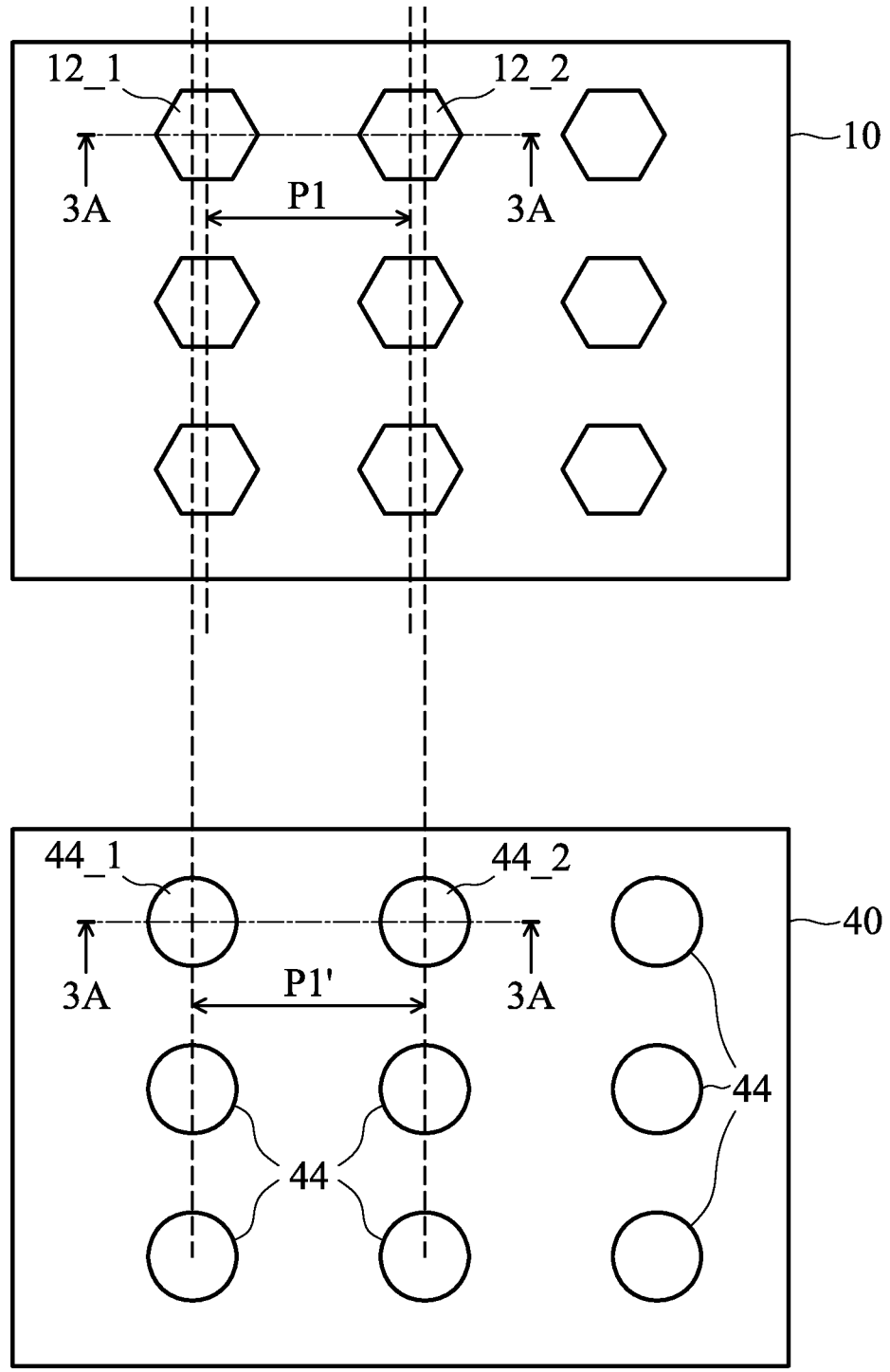

In subsequent process steps, bumps 14_1 and 14_2 (not shown in FIG. 3A, please refer to FIGS. 6 and 7) are formed on UBMs 12_1 and 12_2, respectively, which bumps are intended to be bonded with bumps 44_1 and 44_2, respectively. Accordingly, as designed, the intended pitch between bumps 44_1 and 44_2 (which may be equal to the pitch between UBMs 42_1 and 42_2) is equal to pitch P1' between bumps 14_1 and 14_2. However, due to the stresses caused by material difference (such as the difference between coefficient of thermal expansion (CTE) between different layers of materials) in package substrate 40 (and possibly in semiconductor chip 10), package substrate 40 and/or semiconductor chip 10 may be distorted (for example bent), and the resulting pitch P1' is different from the designed value. As a result, in FIG. 3, pitch P1 is different from pitch P1'. Throughout the description, the term "distortion" is used to refer to the change in the position and the pitches of bumps, wherein the distortion may include position shift, rotation, and/or any other third-order distortion (which is non-uniform distortion). For illustration purpose, pitch P1 of UBMs 12 is shown as smaller than pitch P1' of bumps 44, although in practical cases, pitch P1 may be greater or smaller than pitch P1'. A top view of the structure in FIG. 3A is illustrated in FIG. 3B. The top view shows that semiconductor chip 10 may include a plurality of UBMs 42, and package substrate 40 may include a plurality of bumps 44. The cross-sectional view shown in FIG. 3A is obtained from the planes crossing lines 3A-3A in FIG. 3B.

Figure 4:
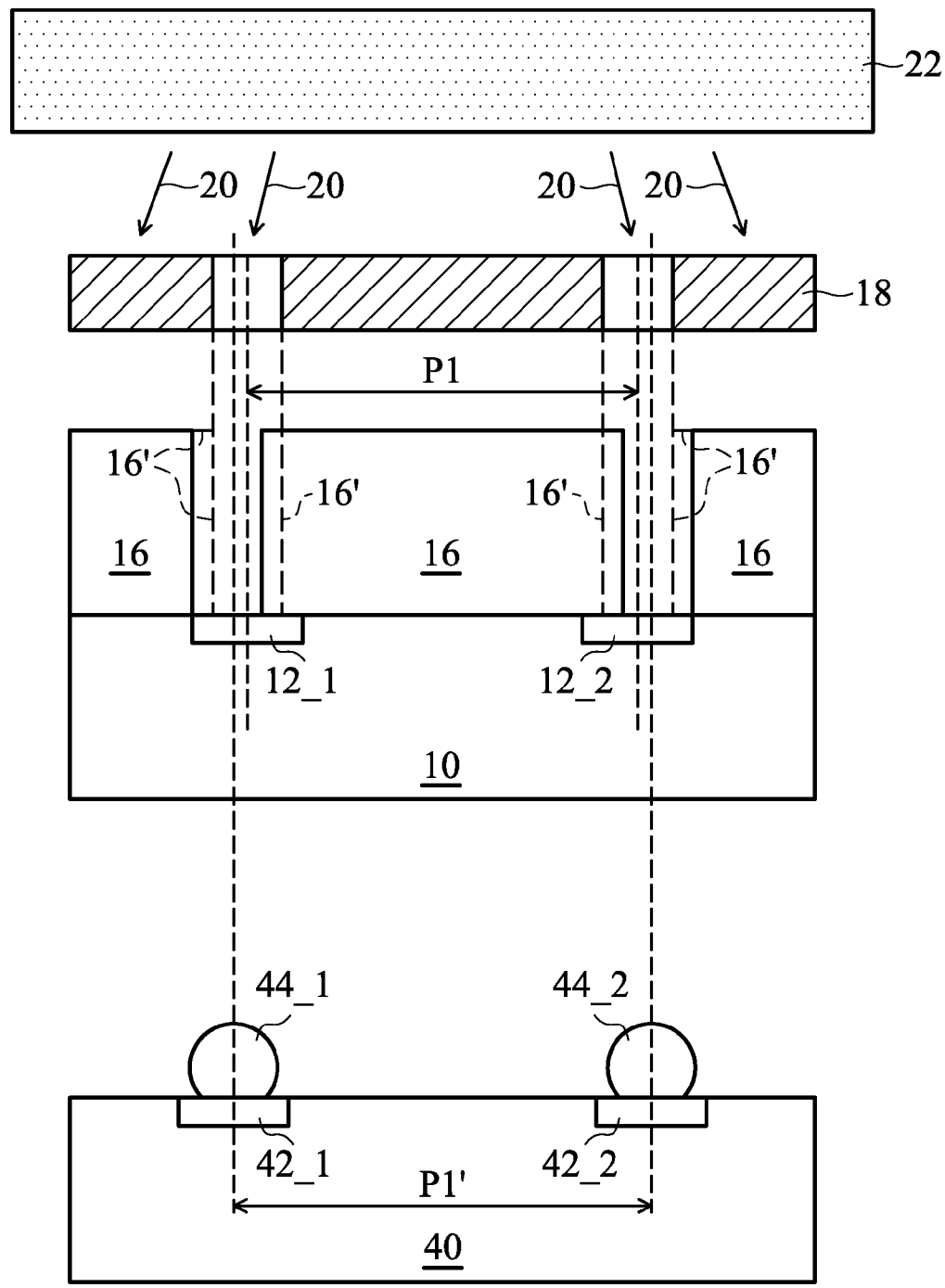
Figure 6:
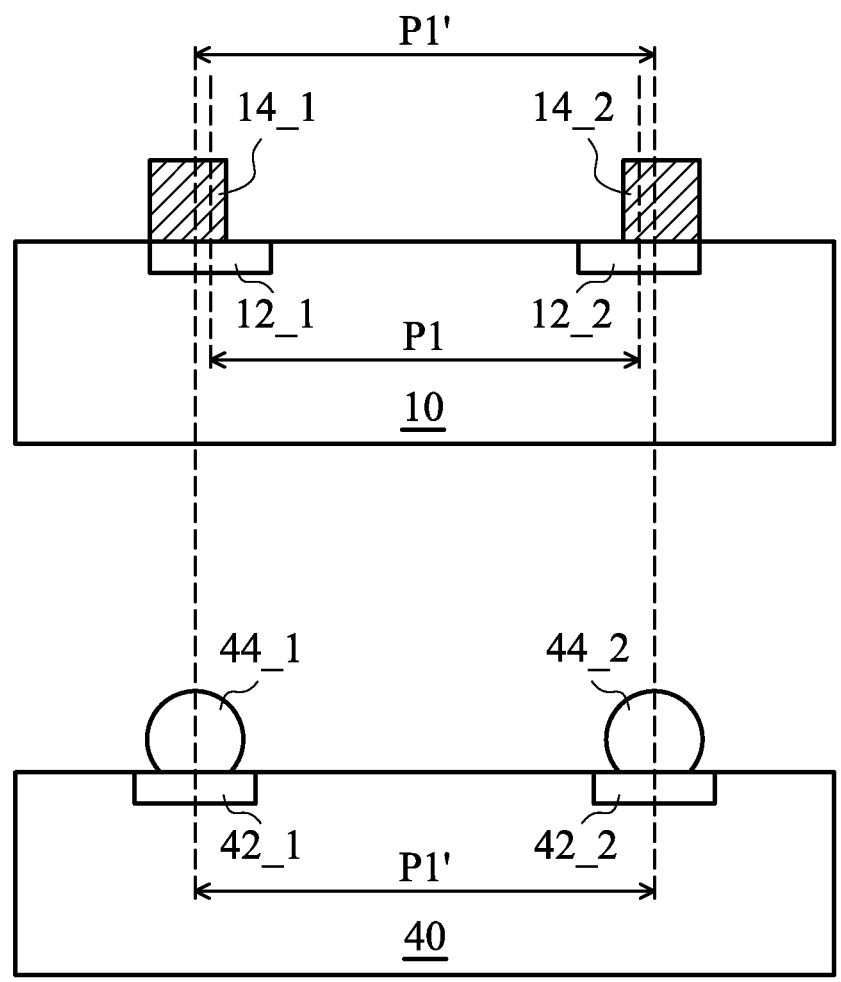
Figure 7:
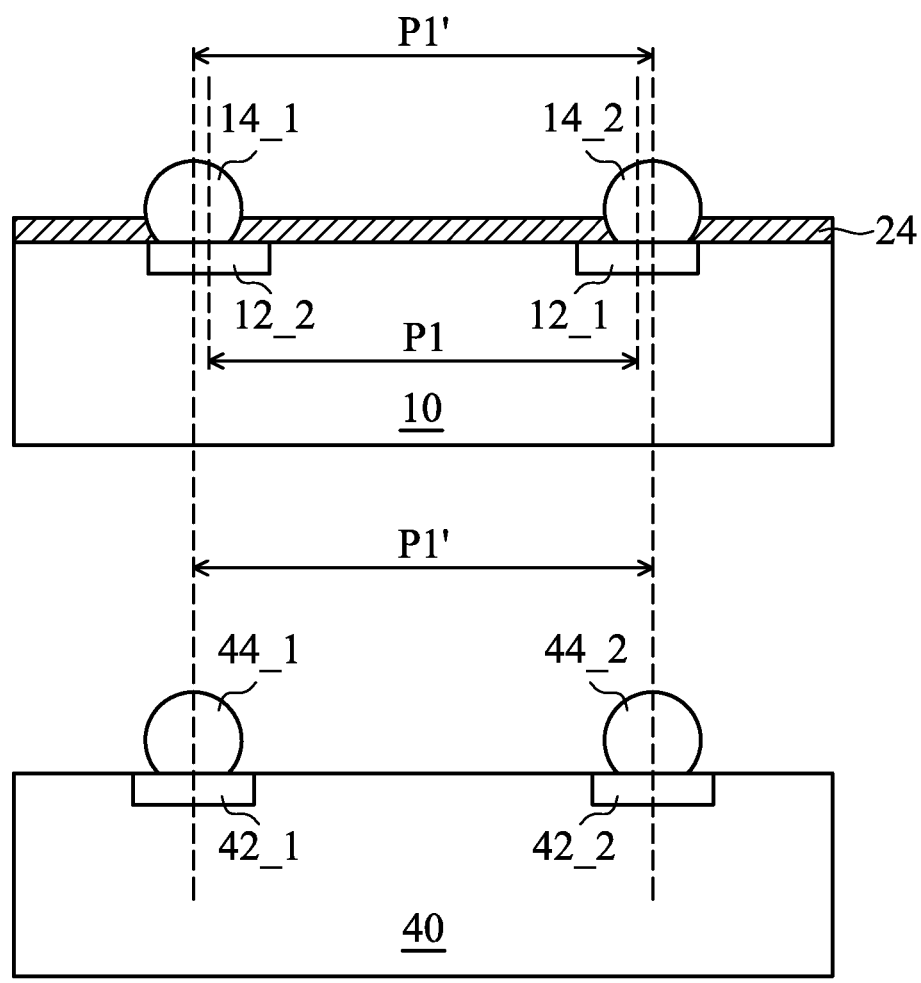

In an embodiment, after the formation of package substrate 40 is finished, the pitches (such as pitch P1') between bumps 44 are measured. The measured pitches may be compared with the designed pitch of bumps (which is intended to be equal to pitch P1) to determine the position distortion values of bumps 44. Bumps 14 (denoted as 14_1 and 14_2 in FIGS. 5 through 7) are then formed so that their pitches match the measured pitches P1'. An exemplary formation step is illustrated in FIG. 4, which illustrates the exposure of photo resist 16 (photo resist 16 may also be replaced by other mask materials such as dry films). Please note that the shape of the illustrated photo resist 16 is actually after the exposure and after the development, rather than the shape of photo resist 16 at the time the exposure is performed. Photo resist 16 defines the pattern and the position of bumps 14 (FIGS. 6 and 7). In an embodiment, the exposure of photo resist 16 is performed using lithography mask 18, which includes transparent patterns for allowing light to pass through and opaque patterns for blocking the light. The pattern of lithography mask 18 does not take the bump distortion in package substrate 40 into account. Therefore, the pitch between the patterns for defining bumps 14 is still P1.

In order to ensure that the bumps formed directly on UBMs 12_1 and 12_2 are aligned with bumps 44_1 and 44_2, the bumps to be formed on UBMs 12_1 and 12_2 need to have pitch P1'. Accordingly, in the exposure of photo resist 16, an overlay offset is applied to the exposure step, wherein the overlay offset (as symbolized by slanted arrows 20) is performed by the apparatus for performing the exposure, such as the schematically illustrated stepper 22. The overlay offset causes the pitch P1' in the exposed photo resist 16 to be different from the pitch P1 in lithography mask 18. If the overlay offset is not applied, the boundaries of the openings in photo resist 16 would have been at the locations shown as 16'. Since pitch P1' is greater than pitch P1, the overlay offset causes the expansion (which is one type of scaling) of patterns. In other embodiments, depending on the position distortion of bumps 44, stepper 22 may be adjusted so that the overlay offset causes the shrinkage, rotation, and/or third-order distortion of the exposed patterns in photo resist 16.

Figure 5:
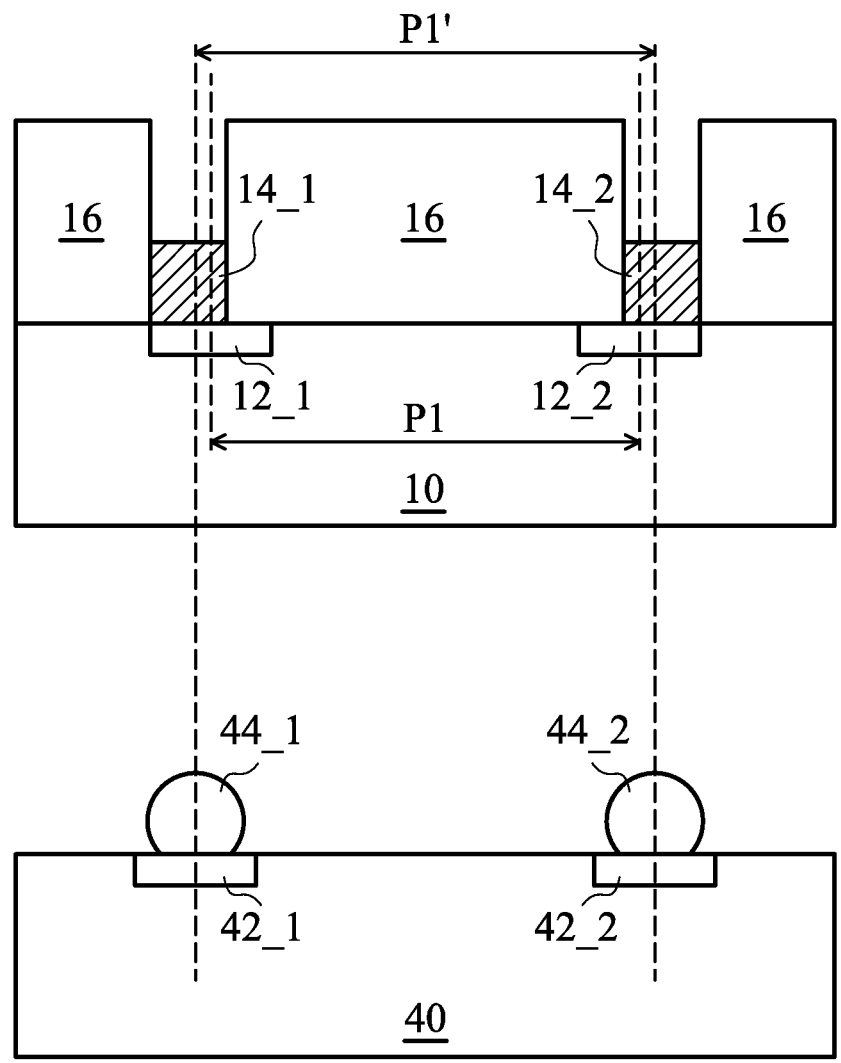

Referring to FIG. 5, bumps 14 (denoted as 14_1 and 14_2) are formed, for example, by plating. Bumps 14 may be formed of plated copper and may further include a plated nickel layer (not shown) on the plated copper. Further, a thin layer of plated solder (not shown) may also be formed on the plated nickel. After the formation of bumps 14, photo resist 16 is removed. The resulting structure is shown in FIG. 6. It is observed that due to the overlay offset, bumps 14 and bumps 44 have the same pitch P1', and hence can be bonded without misalignment. In addition, it is further observed that bumps 14 may be misaligned to the respective underlying UBMs 12.

FIG. 7 illustrates an alternative embodiment, wherein bumps 14 are solder bumps instead of copper bumps as shown in FIGS. 5 and 6. In the formation of solder bumps 14, the positions of solder bumps 14 are also defined by applying the overlay offset, which may be applied in the patterning of a photo resist (not shown) that is used for patterning dielectric layer 24, through which UBMs 12 are joined with bumps 14. The details for applying the overlay offset are essentially the same as discussed in preceding paragraphs and hence are not repeated herein.

Figure 8:
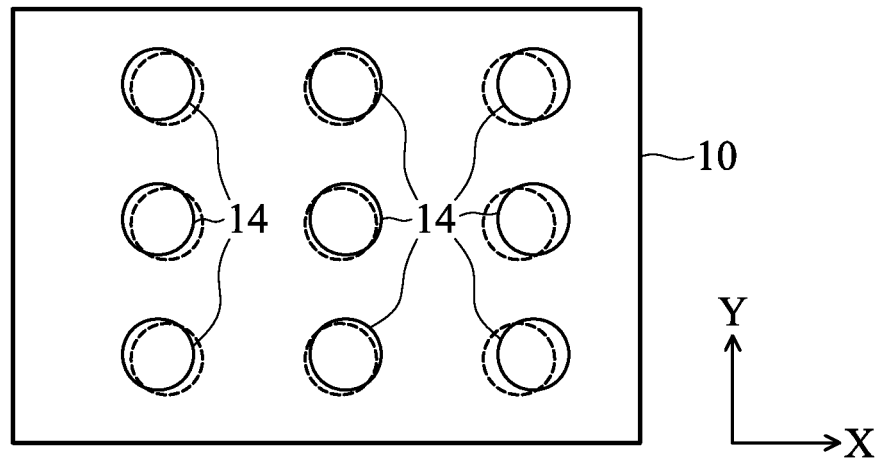
FIG. 8 illustrates a top view of a semiconductor chip, wherein an overlay offset for forming bumps is applied.

A top view of semiconductor chip 10 as manufactured using the steps in FIGS. 3 through 7 is illustrated in FIG. 8. To illustrate the effect of the overlay offset, patterns shown with solid lines are the patterns with the overlay offset applied and are the patterns as manufactured. Patterns shown with dotted circles are the patterns without the overlay offset and are the patterns as in lithography mask 18 (FIG. 4). The positions of the patterns with dotted circles are also the positions of UBMs 12. It is noted that the pitches of bumps 14 are scaled in the X direction.

Figure 9:
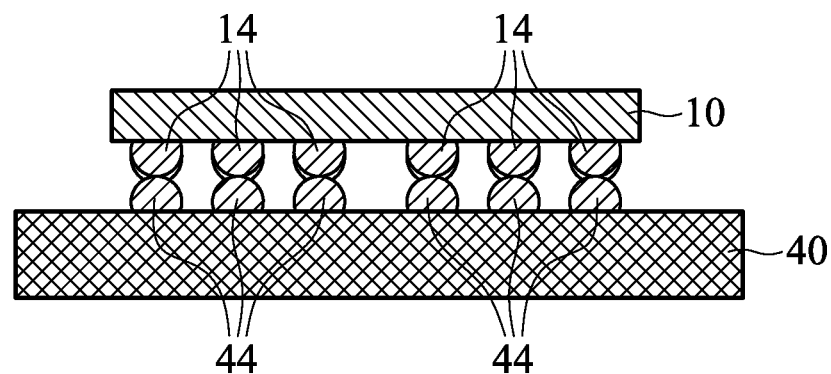
FIG. 9 illustrates the bonding of the semiconductor chip to a package substrate.

FIG. 9 schematically illustrates the bonding of semiconductor chip 10 and package substrate 40. With the overlay offset applied in the formation of bumps 14, bumps 14 are accurately aligned with respective ones of bumps 44. After the structure as shown in FIG. 9 is formed, solders in bumps 44 and/or 14 are re-flowed to form a package assembly.

Figure 10:
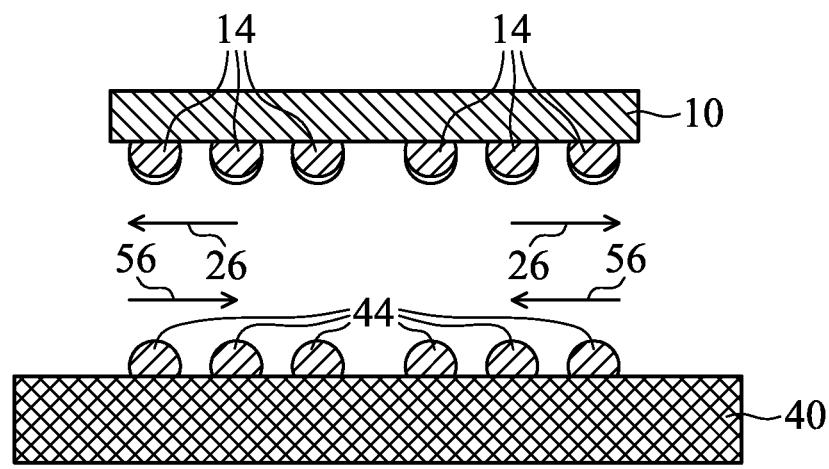
FIG. 10 illustrates cross-sectional views of a semiconductor chip and a package substrate, wherein overlay offsets are applied in the formation of bumps in both the semiconductor chip and the package substrate.

FIG. 10 illustrates a cross-sectional view of an alternative embodiment, wherein instead of applying the overlay offset only to semiconductor chip 10, an additional overlay offset is applied to package substrate 40. In this case, the overlay offset in the formation of bumps 14 and the additional overlay offset applied in the formation of bumps 44, in combination, compensates for the position/pitch difference between semiconductor chip 10 and package substrate 40 and hence bumps 14 and 44 may be aligned. The process for applying the overlay offset to bumps 44, which may have the same or different structures as bumps 14, is essentially the same as discussed in preceding paragraphs. Please note that that the overlay offset (symbolized by arrows 26) for forming bumps 14 and the overlay offset (symbolized by arrows 56) for forming bumps 44 are inversed, that is, if overlay offset 26 is to increase the pitch of bumps 14, then overlay offset 56 is to decrease the pitch of bumps 44, and vice versa.

Figure 11:
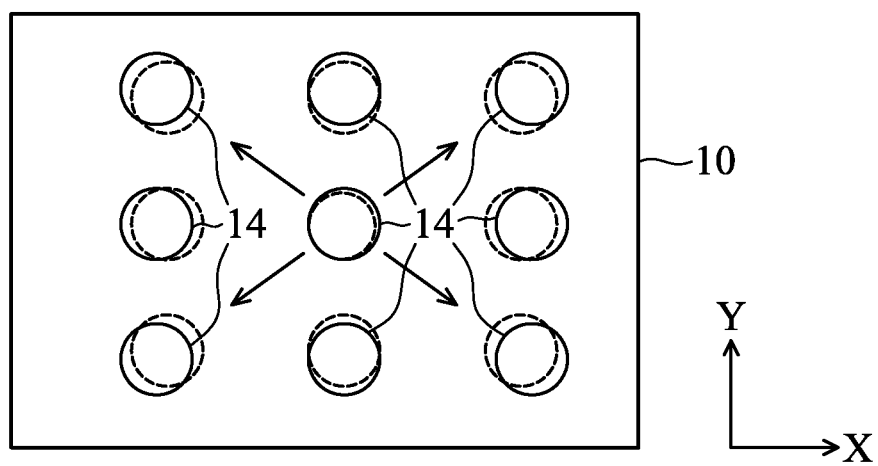
FIG. 11 illustrates a top view of a semiconductor chip, wherein an overlay offset for forming bumps is applied in both X and Y directions.
Figure 12:
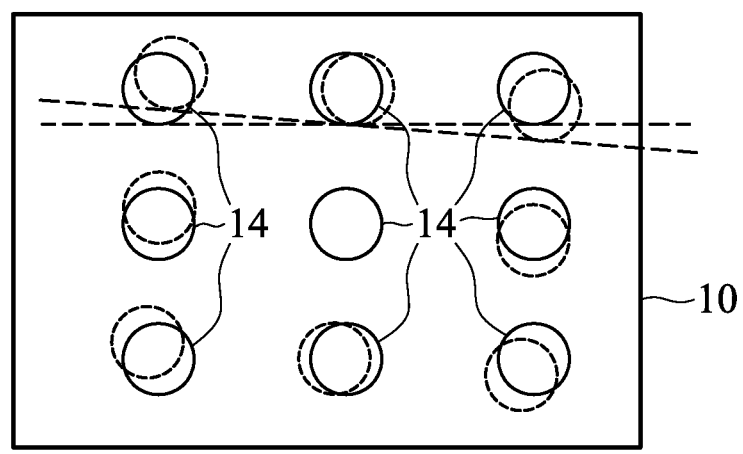
FIG. 12 illustrates a top view of a semiconductor chip, wherein an overlay offset for forming bumps is applied to rotate bumps.

FIGS. 11 and 12 illustrate two alternative embodiments. FIG. 11 illustrates bumps 14 formed with a two-dimensional overlay offset, which is applied to both X and Y directions of semiconductor chip 10 (or package substrate 40). Further, a situation may arise that the misalignment of bumps 14 and 44 requires the rotation of bumps 14 and/or bumps 44. FIG. 12 illustrates an exemplary embodiment, wherein the overlay offset is applied to rotate bumps 14 and/or 44, relative to their designed positions and relative to the directions of the underlying features, such as UBMs 12.

It is realized that there are many variations to implement the embodiments. For example, the overlay offset may be applied to the formation of bumps 14 and/or 44, but not to the formation of underlying features, such as UBMs 12 and/or 42, so that the manufacturing costs can be reduced. In alternative embodiments, however, the formation of one or more underlying layers, such as UBMs 12 and/or 44, may also be applied with overlay offsets, while the remaining ones of the underlying layers are not applied with any overlay offset. In yet other embodiments, various overlay offsets, such as expansion, reduction, rotation, and third-order distortion, may be combined to align bumps 14 with bumps 44 as much as possible.

Figure 13:
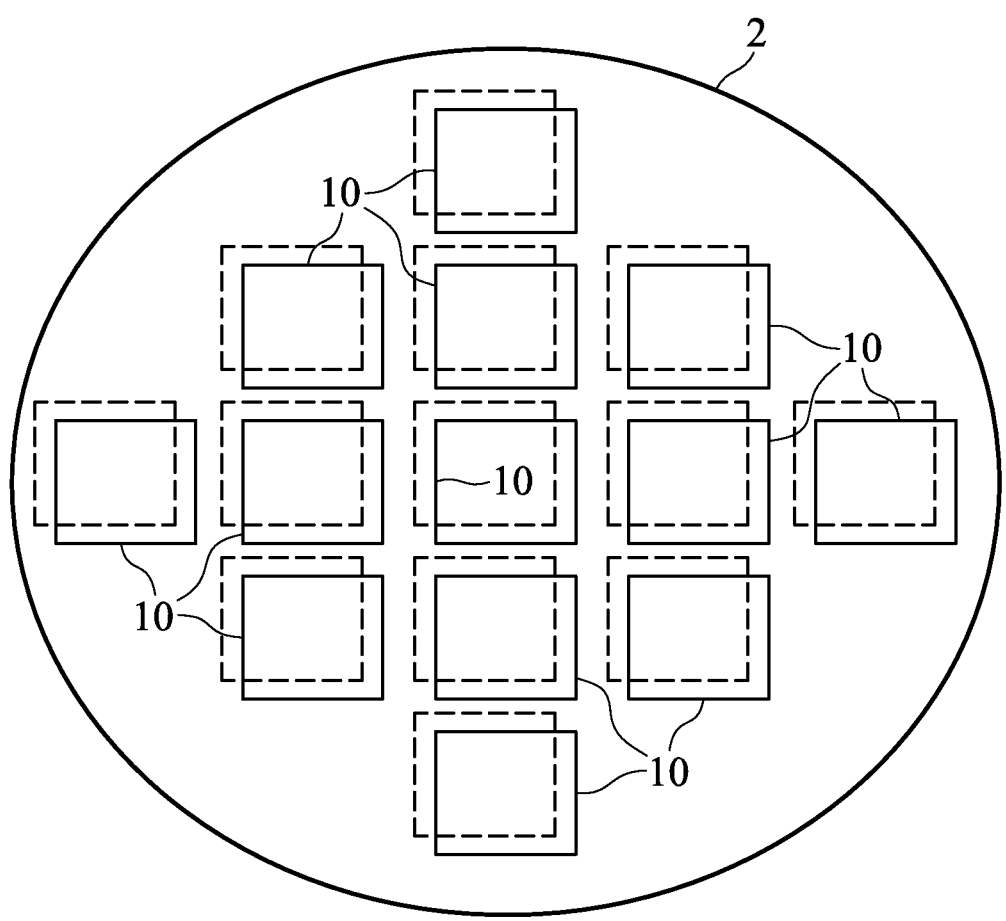
FIG. 13 illustrates that overlay offsets are applied globally to semiconductor chips on a wafer, wherein bump positions are globally translated.
Figure 14:
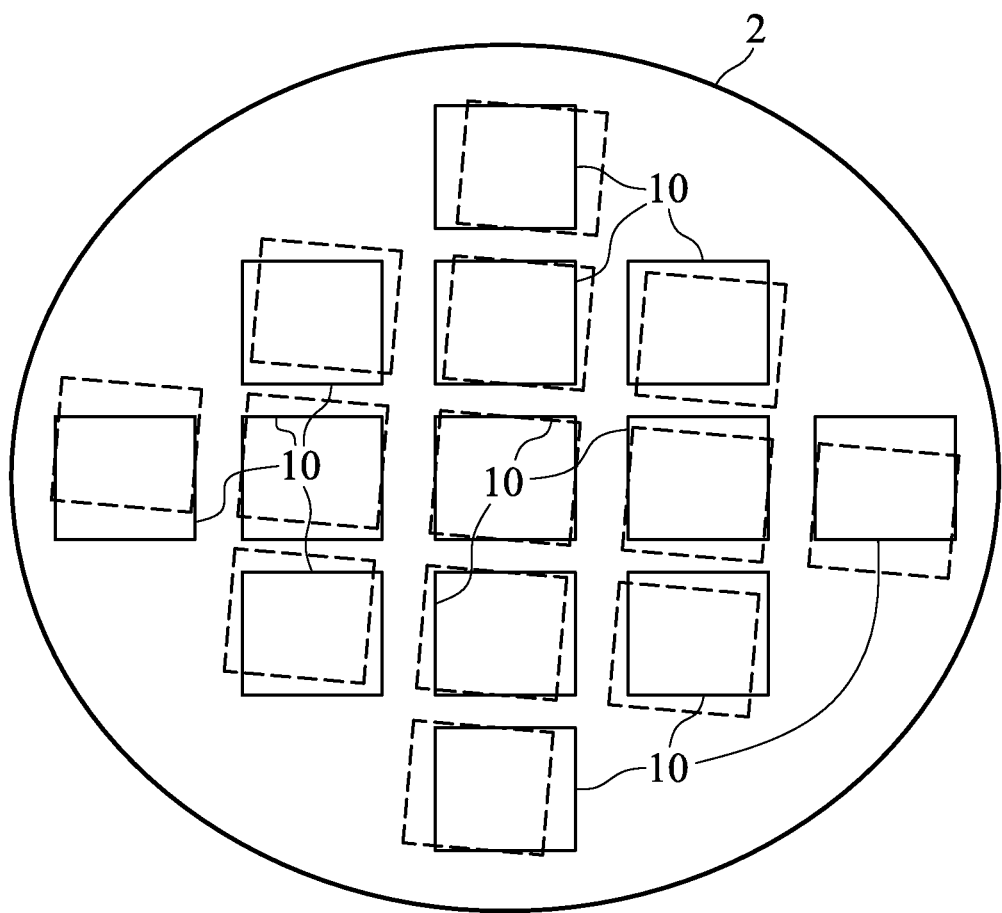
FIG. 14 illustrates that overlay offsets are applied globally to semiconductor chips on a wafer, wherein bump positions are globally rotated.
Figure 15:
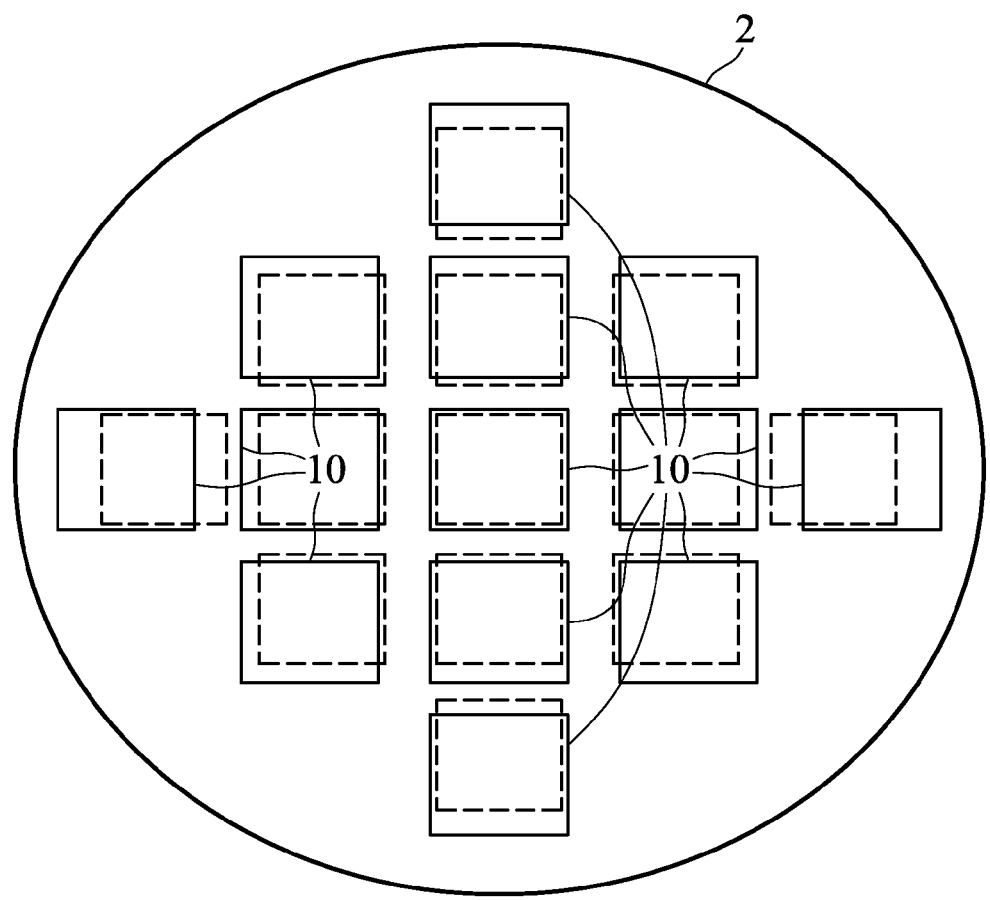
FIG. 15 illustrates that overlay offsets are applied globally to semiconductor chips on a wafer, wherein bump positions are globally scaled.

The overlay offsets may be applied globally to all chips in a wafer or to only some of the chips in the wafer. When stepper 22 (refer to FIG. 4) is used to expose photo resist 16, each of semiconductor chips 10 in a same wafer may require an exposure step. Accordingly, for the exposure of each of semiconductor chips 10, the overlay offset may be applied either globally or individually. FIGS. 13 through 15 further illustrate several scenarios for globally applying overlay offsets to the chips in a same wafer. In FIG. 13, semiconductor chips 10, in wafer 2, have a same level of distortion and the formation of bumps 14 (not shown) in all chips are applied with a same overlay offset (referred to as a translation of positions). In FIG. 14, semiconductor chips 10, in wafer 2, have different rotation distortions, with the chips close to the center of wafer 2 having smaller rotation distortions than the chips farther away from the center. A symmetric rotation is thus performed. In FIG. 15, semiconductor chips 10, in wafer 2 have different shift distortions, with the chips closer to the center of wafer 2 having smaller shift distortions than the chips farther away from the center. A symmetric scaling is thus performed, so that smaller overlay offsets are applied to the chips closer to the center and greater overlay offsets are applied to the chips farther away from the center.

The embodiments have several advantageous features. The misalignment between bumps on semiconductor chips and package substrates may be eliminated. The solution does not require an increase in the manufacturing cost since it only involves one measurement and the remaining work is performed automatically by the stepper.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   providing a semiconductor chip comprising metallic features;
   providing a photolithography mask comprising first patterns;
   defining second patterns for metal bumps configured to connect the semiconductor chip to an external device, with an overlay offset being applied to the first patterns to form the second patterns; and
   forming the metal bumps on the semiconductor chip and electrically connected to the metallic features.

2. The method of claim 1, wherein the overlay offset comprises scaling.

3. The method of claim 1, wherein the overlay offset comprises rotation.

4. The method of claim 1, wherein the steps of defining the patterns for the metal bumps and forming the metal bumps comprise:
   forming a photo resist over the metallic features;
   exposing the photo resist using the photolithography mask, with the overlay offset applied during the step of exposing;
   developing the photo resist; and
   plating copper into openings in the photo resist to form the metal bumps.

5. The method of claim 1 further comprising:
   providing a package substrate comprising additional metal bumps; and
   measuring positions of the additional metal bumps to determine the overlay offset.

6. The method of claim 5, wherein the metallic features comprises under bump metallurgies (UBMs), and wherein the UBMs are misaligned with the respective metal bumps.

7. The method of claim 5, wherein the step of providing the package substrate comprises:
   providing an additional lithography mask;
   forming an additional photo resist on the package substrate;
   exposing the additional photo resist to form additional patterns for the additional metal bumps, with an additional overlay offset applied during the step of exposing the additional photo resist; and
   forming the additional metal bumps in openings of the additional photo resist.

8. The method of claim 5, wherein the step of providing the semiconductor chip comprises forming the metallic features, and wherein the overlay offset is not applied in the step of forming the metallic features.

9. A method of forming an integrated circuit, the method comprising:
   providing a package substrate comprising first metal bumps;

providing a semiconductor chip comprising under bump metallurgies (UBMs);

forming and exposing a photo resist to form patterns in the photo resist, wherein during the step of exposing the photo resist, an overlay offset is applied to align the patterns to respective first metal bumps;

forming second metal bumps in openings in the photo resist, wherein the second metal bumps are electrically connected to the UBMs; and bonding the semiconductor chip to the package substrate, with first metal bumps being bonded to respective ones of the second metal bumps.

10. The method of claim 9, wherein the UBMs are misaligned with connecting ones of the second metal bumps.

11. The method of claim 9 further comprising:
measuring positions of the first metal bumps;
comparing the positions of the first metal bumps with intended design positions of the first metal bumps to find a distortion of the positions; and
determining the overlay offset using the distortion of the positions.

12. The method of claim 9, wherein the overlay offset comprises scaling.

13. The method of claim 9, wherein the overlay offset comprises rotation.

14. The method of claim 9, wherein the overlay offset is performed globally to chips in a wafer comprising the semiconductor chip, and wherein the overlay offset comprises translation.

15. The method of claim 9, wherein the overlay offset is performed globally to chips in a wafer comprising the semiconductor chip, and wherein the overlay offset comprises symmetric rotation.

16. The method of claim 9, wherein the overlay offset is performed globally to chips in a wafer comprising the semiconductor chip, and wherein the overlay offset comprises symmetric scaling.

17. A method of forming an integrated circuit, the method comprising:
providing a package substrate comprising first metal bumps;
providing a semiconductor chip comprising under bump metallurgies (UBMs);
measuring positions of the first metal bumps;
comparing the positions of the first metal bumps with intended design positions of the first metal bumps to determine an overlay offset;
forming and exposing a photo resist to form openings in the photo resist, wherein during the step of exposing the photo resist, the overlay offset is applied; and
forming second metal bumps in the openings in the photo resist, wherein the second metal bumps are electrically connected to the UBMs.

18. The method of claim 17 further comprising bonding the semiconductor chip to the package substrate, with the second metal bumps being aligned with respective ones of the first metal bumps, wherein the UBMs are misaligned with respective ones of the first metal bumps.

19. The method of claim 17, wherein the step of providing the semiconductor chip comprises forming the UBMs, and wherein no overlay offset is applied to the step of forming the UBMs.

20. The method of claim 17, wherein the second metal bumps comprises a solder.

* * * * *